United States Patent [19]

von Criegern et al.

[11] Patent Number: 4,465,935
[45] Date of Patent: Aug. 14, 1984

[54] ELECTRICALLY CONDUCTIVE SAMPLE SUPPORT-MOUNTING FOR SECONDARY ION MASS SPECTROMETER ANALYSIS

[75] Inventors: Rolf von Criegern, Geretsried; Ingo Weitzel, Taufkirchen, both of Fed. Rep. of Germany

[73] Assignee: Siemens Aktiengesellschaft, Berlin and Munich, Fed. Rep. of Germany

[21] Appl. No.: 381,044

[22] Filed: May 24, 1982

[30] Foreign Application Priority Data

Jul. 21, 1981 [EP] European Pat. Off. ............ 3128814
Feb. 4, 1982 [DE] Fed. Rep. of Germany ..... 82100811

[51] Int. Cl.³ .................... G01N 21/00; G01N 23/00
[52] U.S. Cl. .............................. 250/440.1; 250/309; 250/251
[58] Field of Search ............... 250/306, 309, 281, 288, 250/289, 440.1, 442.1, 305, 251

[56] References Cited

U.S. PATENT DOCUMENTS

| 3,086,112 | 4/1963 | Riecke | 250/442.1 |
| 4,097,738 | 6/1978 | Feve et al. | 250/305 |
| 4,310,759 | 1/1982 | Oechsner | 250/309 |
| 4,310,764 | 1/1982 | Iijima | 250/440.1 |

OTHER PUBLICATIONS

"Raster Scanning Depth Profiling of Layer Structures", Applied Physics 12, pp. 149–156 (1977).
"Dynamic Range 10⁶ in Depth Profiling Using Secondary-Ion Mass Spectrometry", Applied Physics Letters 37 (3), pp. 285–287 (Aug. 1, 1980).

Primary Examiner—Bruce C. Anderson
Attorney, Agent, or Firm—Hill, Van Santen, Steadman & Simpson

[57] ABSTRACT

An electrically conductive sample support mounting for the analysis technique of secondary ion mass spectrometry employs a sample plate accommodating the sample. At the sample plate surface facing an ion beam or neutral particle beam, the sample is arranged in an environment-free fashion fully in the interior of the region impinged or scanned by the ion beam or neutral particle beam. Through the creation of a so-called orifice, interfering influences which can arise from a crater rim and from its surroundings are entirely eliminated. The invention is applied in the case of depth profile measurement of ion-implanted doping materials in semiconductor crystal disks and for the purpose of ultrasensitive trace analysis in solids.

11 Claims, 4 Drawing Figures

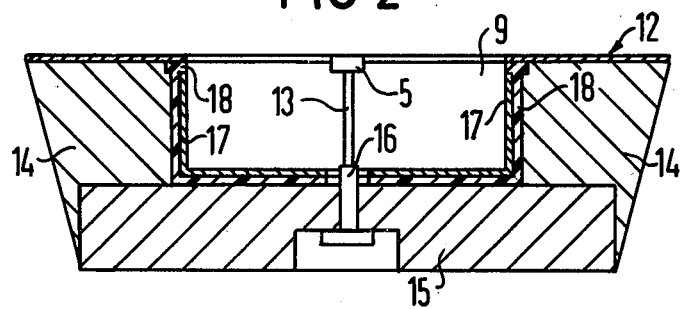
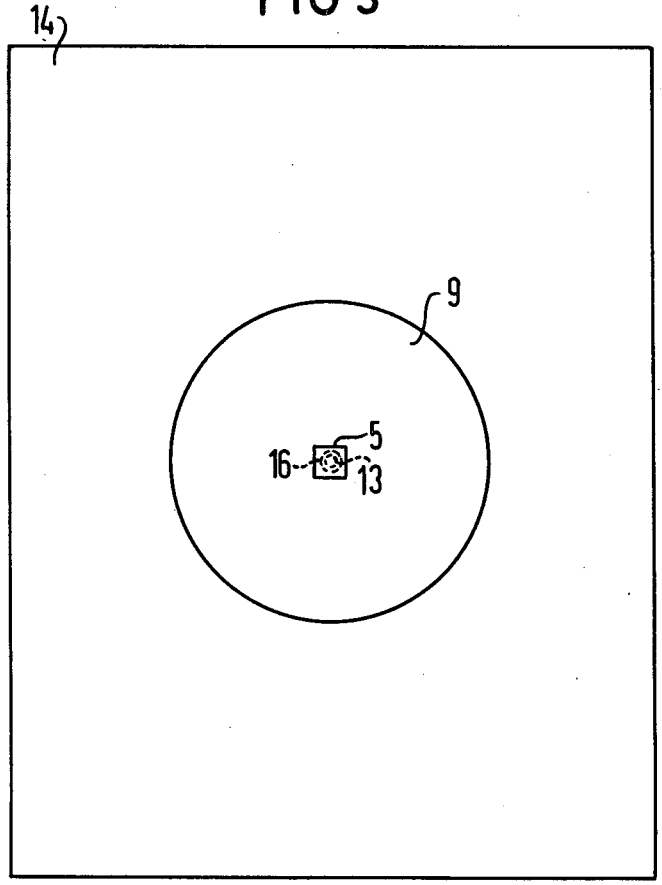

ELECTRICALLY CONDUCTIVE SAMPLE SUPPORT-MOUNTING FOR SECONDARY ION MASS SPECTROMETER ANALYSIS

BACKGROUND OF THE INVENTION

The present invention relates to an electrically conductive sample support-mounting for secondary ion mass spectrometry analysis in which the sample to be analyzed is bombarded in a vacuum with an ion or neutral particle beam. The sample is eroded at the impinged location, and the secondary ions resulting during the erosion are analyzed in a mass spectrometer. Here, an atomic beam or molecular beam is to be understood as a neutral particle beam.

The analysis method of secondary ion mass spectrometry (SIMS) is very sensitive. It can analyze traces of impurities in a material down to the ppm-range, in some instances, down to ppb-range. For this reason SIMS possesses great significance for the examination of semiconductor crystals. For example, it is highly useful for the measurement of the concentration of an ion-implanted doping material in dependence upon the sample depth. In addition, this technique is also applicable to general trace analysis.

For the attainment of maximum detection sensitivities it is necessary to detect contributions to the measuring signal exclusively from the center region of the eroded layer, the socalled sputtering crater, and to keep all secondary ions from the rim of the crater or its surroundings away from the measurement.

It is known (see the article of K. Wittmaack in Appl. Phys. 12, pp. 149–156 (1977), incorporated herein by reference), to scan the ion beam over or impinge it upon a square surface of e.g. 1 mm$^2$ and to thereby generate an erosion crater with a flat bottom. In order not to jointly measure signal contributions from the rim of the crater, the measurement detection (pulse counting) is electronically interrupted as soon as the ion beam leaves a center region of the crater ("electronic gate"). Rapid neutral particles which arise in the ion beam and do not participate in the beam scanning (because they are not deflectable), can however not be prevented by the "electronic gate" from triggering signal contributions from the crater rim or from the surroundings.

As can be learned from an article of K. Wittmaack and J. B. Clegg from Appl. Phys. Lett. 37 (3), pp. 285–287 (Aug. 1, 1980) incorporated herein by reference, such neutral particles can be prevented to a substantial proportion from striking the sample through bending of the ion beam.

However, the following interference components can be eliminated neither by the electronic marginal blocking ("gate") nor by an ion beam bend or curvature:

1. rapid neutral particles which are created after the ion beam bend;
2. ions from far-reaching tails of the ion beam (dependent upon the focusing conditions); and
3. electrons from an electron beam simultaneously directed to the sample for the purpose of avoiding charging of the sample due to the ion beam ("compensation" of charges in the case of insulators and semiconductors).

The particle types cited herein become interfering components impairing the detection sensitivity of impurities (dopant atoms inter alia) in that they trigger undesired signal components from the region of the crater rim or the surrounding regions of the crater. Similar interfering effects also occur in the case of application of a neutral particle beam.

SUMMARY OF THE INVENTION

An object underlying the invention is the avoidance of undesired measuring signals by the elimination of the crater rim and its surroundings.

This object is achieved in the case of an electrically conductive sample support-mounting as initially cited by providing a sample plate accommodating the sample. This plate, at its surface facing the ion beam or neutral particle beam, is designed such that the sample is arranged in an environment-free fashion completely in the interior of the region struck or scanned by the ion beam or neutral particle beam. In this manner, in the case of the application of an ion beam, the reversal points of the ion beam movement during scanning, and hence the "crater rim", come to lie outside the boundaries of the sample. In the case of application of a neutral particle beam, in an analogous fashion it can be achieved that the edge of the region struck by the beam lies outside the boundaries of the sample. Signal contributions from the environment of the sample, i.e. of the crater rim, are eliminated by virtue of the fact that the sample is basically mounted in a support free fashion in front of an orifice in the sample plate. No primary particles whatsoever can any longer strike in the environment of the analyzed crater of the sample. On the contrary, following passage through the orifice, they reach at a sufficient distance a surface from which the mass spectrometer no longer accepts any measuring signals.

BRIEF DESCRIPTION OF THE DRAWINGS

FIGS. 1 and 2 schematically illustrate in a sectional diagram two different embodiments of sample support-mountings which are suitable for a bombardment with ion beams;

FIG. 3 illustrates a plan view of the sample support-mounting according to FIG. 2.

DESCRIPTION OF THE PREFERRED EMBODIMENTS

Figure 1:
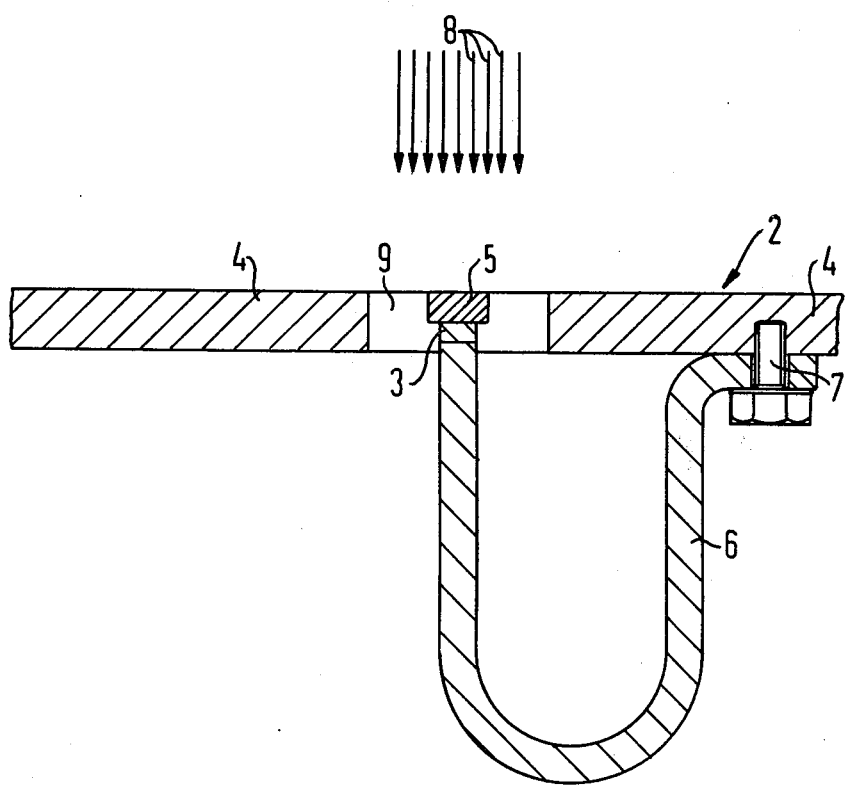

In FIG. 1 a sample support-mounting is illustrated in which the sample plate 2 consists of three parts 3, 4 and 6, e.g. of aluminum. These parts 3, 4, and 6 are arranged concentrically relative to one another. The inner part 6, which supports the sample 5 to be analyzed, consists of a platform forming a sample support surface 3 connected to the inner part 6 forming a support arm bent in a U-shaped fashion. The support arm 6, at its end opposite the sample support surface 3, is electrically and mechanically connected in fixed manner with the exterior part 4 of the sample plate 2 by means of a bolt 7. The sample support surface, relative to its spatial dimension, is smaller than the sample surface 5 (sample size e.g. 1 mm × 1 mm) impinged upon or scanned by the ion beam 8. Signal contributions from the surroundings of the sample 5 are eliminated since the sample 5 is mounted basically support-free in front of an orifice 9 in the sample plate 2.

The surface of the sample 5 is disposed in the same plane as the surface of the surrounding support-mounting part 4. Given the same electric potential of both parts 4 and 5, in the space between the sample plate and the mass spectrometer the same electric field strength distribution is there approximated as results in the case of the presence of a plane sample plate without an orifice (conventional construction method). It is advantageous to permit the surface of the sample 5 to project a small amount above the front plane of the plate 4 in order to be able to preclude a coating of the sample surface 5 with material sputtered off from the part 4 during the sample and apparatus adjustment. It can likewise be expedient or necessary to connect the parts 4 and 5 to different electrical potentials in order e.g. to obtain the desired field strength distribution in the case of poorly conductive samples during the bombardment with ions and possibly also electrons. In this case, the support arm 6 would have to be mechanically connected with the support part 4 via an insulating piece not illustrated here, and the support arm 6 would have to be electrically separately contacted. Alternatively, the support arm 6 could be an insulator.

The same principle also applies for the embodiment illustrated in FIGS. 2 and 3. Here the orifice 9 only has a minimum depth of approximately 5 mm. The sample 5 is conductively cemented on a pin or rod 13 arranged in the center of the sample plate 12. The pin is guided via an adjusting screw 16 through a base plate 15 supporting the sample plate 12, and is axially displaceable in height. Here also the surface-wise extent of the sample 5 is greater than the pin-shaped platform 13 which supports the sample 5. The exterior sample plate 14 forms the border of the so-called aperture or orifice 9. The aperture 9, resulting in the sample plate 12 through the arrangement of the two parts 13 and 14, is provided with a metal lining 17, electrically insulating in relation to the base plate 15 and the exterior marginal region 14. This metal lining consists e.g. of high-grade steel or aluminum, and which is interrupted in the region of the centering pin 13 at the base of the sample plate 12. The sample 5, in the case of this embodiment, is at the same potential as the part 14 of the sample plate 12 which forms the border of the orifice 9. Accordingly, approximately the same field strength distribution in the space between the sample 5 and mass spectrometer is guaranteed as in the case of the known sample support-mountings.

The metal lining can be connected to a suitable potential in relation to the sample plate 12 (parts 13 and 14), in order to prevent secondary ions from the base of the aperture 9 from leaving the aperture 9. Reference number 18 designates insulating disks. It is also possible to reduce the aperture diameter through insertion of diaphragms.

In FIG. 3, the same reference signs are employed as in FIG. 2.

Figure 4:
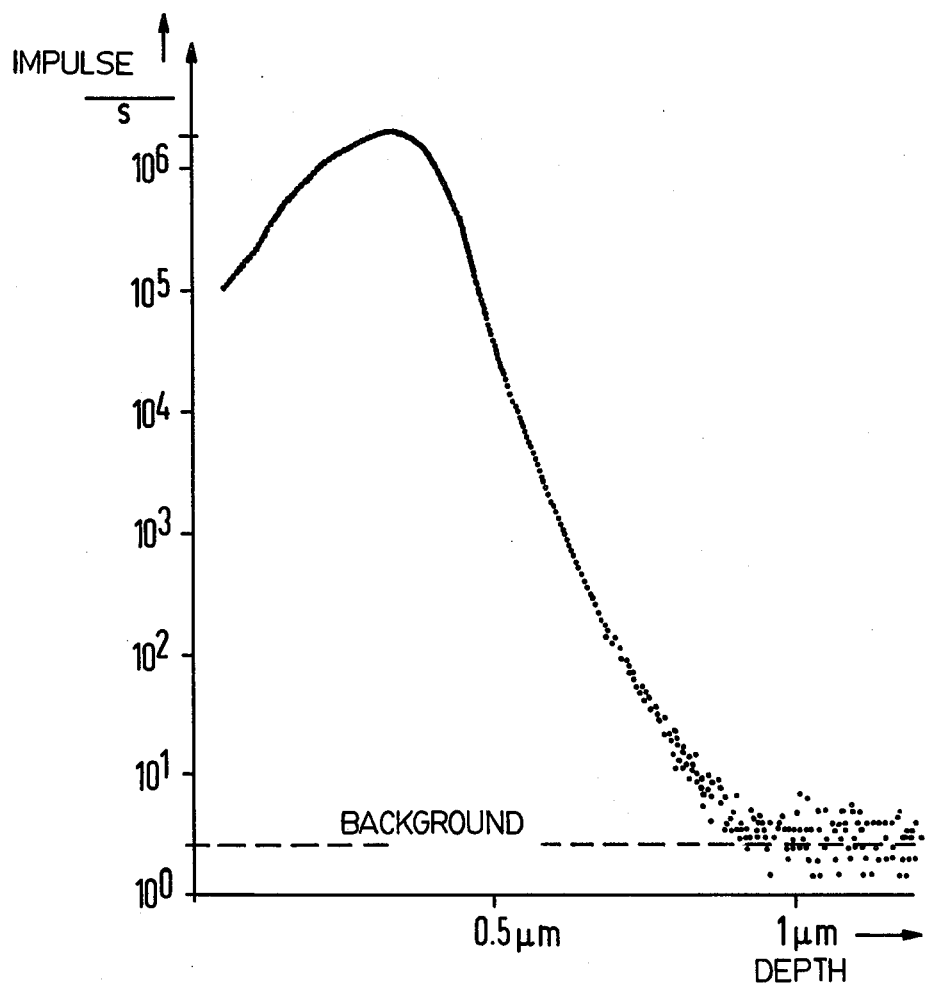
FIG. 4 illustrates a depth profile of ion-implanted boron in silicon, recorded with an inventive sample support mounting where the measurement occurs, by use of an O$_2^+$ ion beam.

In FIG. 4 the concentration profile of ion-implanted boron (dose $10^{16}$ cm$^{-2}$, energy 70 keV) in a silicon crystal disk is plotted. The depth ($\mu$m) here serves as the abscissa and the pulse rate (pulse/s) of the measuring signal of $M_B+$ serves as the ordinate. The measurement proceeds pursuant to utilization of an $O^+_2$ ion beam (12 keV, 2 $\mu$A).

This "depth profile" shows a progression of the boron signals over almost 6 powers of ten from the maximum to the constant signal background.

A high dynamics of this type was previously attained on a structural apparatus with conventional sample support-mounting, only by Wittmaack and Clegg (see introduction to specification). However, for this purpose a considerable optimization expense and very good vacuum conditions were necessary. By contrast, the measurements illustrated in FIG. 4 were conducted in the case of a routinely and rapidly attainable total pressure of greater than $10^{-16}$Pa ($\sim 10^{-8}$ Torr) and without costly optimization. In addition, the measured sample was simultaneously bombarded with an electron beam (30 mA, 500 eV) in order to minimize charge effects. Under these conditions, in the case of the hitherto conventional support-mounting and examination technique, also the sample surface in the environment of the sputtering crater is struck by electrons and can effect an undesired signal background which the measuring curve attains, e.g. already four to five orders of magnitude below the maximum.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A secondary ion mass spectrometry analysis sample support mounting system for depth profiling wherein a mounted sample is analyzed through bombardment with an ion or neutral particle beam in a vacuum, the sample being eroded at an impinging location and secondary ions resulting during the erosion being created which are analyzed in a mass spectrometer, comprising: an electrically conductive sample plate dimensioned and shaped to accommodate the sample; a sample supporting surface of the sample plate facing the ion or neutral particle beam being smaller than a supporting surface of the sample and designed such that the sample is arranged in an environment-free fashion centrally of and completely in an interior of a region impinged upon or scanned by the ion or neutral particle beam, the region impinged upon or scanned being larger than a surface of the sample facing the beam; and said impinged upon region surrounding the sample through which the beam passes so that an entire surface of the sample facing the beam lies completely within the region so that no crater rim is present which would trigger undesired signals during depth profile analysis.

2. A system according to claim 1 wherein the sample plate comprises at least two parts arranged concentrically relative to one another, the innermost of the two parts supporting the sample and having a supporting surface which is smaller than said support surface of the sample which is scanned by the ion or neutral particle beam; the exterior of the two parts being arranged at a spatial distance from the interior part; and a support arm being provided which mechanically and electrically connects the inner part with the exterior part of the sample plate.

3. A system according to claim 1 wherein the sample plate has in an interior region a cavity in a center of which a pin-shaped sample mounting platform is arranged, the platform being guided through a base plate supporting the sample plate and being mechanically and electrically connected via the base plate with the sample plate.

4. A system according to claim 3 wherein the platform for the sample comprises a height adjustable centering pin.

5. A system according to claim 3 wherein the cavity in the sample plate is provided with a metal lining which is electrically insulating relative to the base plate and an external marginal region, the metal lining being interrupted in the region of the centering pin.

6. A system according to claim 3 wherein a metal lining of the cavity is connected to a different potential relative to a conducting external region of the sample plate and the pin-shaped platform.

7. A secondary ion mass spectrometry analysis system for depth profiling wherein a mounted sample is analyzed with a particle beam, comprising: a conductive surface having an opening therein; a conductive sample supporting surface means for supporting the sample centrally within the opening; said supporting surface means having a supporting surface whose lateral dimensions are less than the lateral dimensions of a surface of the sample which abuts the supporting surface such that all portions of the sample overlap beyond the supporting surface means; and the sample being arranged centrally of and completely in an interior of the particle beam which passes through the opening so that no crater rim is present which would trigger undesired signals during depth profile analysis.

8. A system according to claim 7 wherein the supporting surface means positions the surface of the sample opposite the abutment surface substantially in an entrance of the opening towards which the particle beam is directed.

9. A secondary ion mass spectrometry analysis system for depth profiling, comprising: a particle beam source for providing a particle beam; sample support means with a space therearound for positioning and supporting the sample substantially centrally within the particle beam which passes through said space; and a sample resting on the sample supporting surface means, lateral dimensions of the sample perpendicular to the particle beam direction being greater than lateral dimensions of the sample support means and less than a region scanned by the particle beam; and the sample being arranged centrally of and completely in an interior of the particle beam which passes through said space so that no crater rim is present which would trigger undesired signals during depth profile analysis.

10. A system according to claim 9 wherein the supporting means positions a surface of the sample opposite a support surface of the supporting means substantially at an entrance of the opening.

11. A system according to claim 9 wherein the conductive surface is planar.

* * * * *